(12) United States Patent
Voutilainen et al.

(10) Patent No.: US 9,064,140 B2
(45) Date of Patent: Jun. 23, 2015

(54) METHOD FOR TESTING TRANSPONDERS

(75) Inventors: Jukka Voutilainen, Helsinki (FI); Jesse Tuominen, Espoo (FI); Juho Partanen, Helsinki (FI)

(73) Assignee: VOYANTIC OY, Espoo (FI)

( * ) Notice: Subject to any disclaimer, the term of this patent is extended or adjusted under 35 U.S.C. 154(b) by 306 days.

(21) Appl. No.: 13/500,832

(22) PCT Filed: Oct. 6, 2010

(86) PCT No.: PCT/FI2010/050775
§ 371 (c)(1),
(2), (4) Date: Jun. 19, 2012

(87) PCT Pub. No.: WO2011/042603
PCT Pub. Date: Apr. 14, 2011

(65) Prior Publication Data
US 2012/0249169 A1    Oct. 4, 2012

(30) Foreign Application Priority Data
Oct. 9, 2009    (FI) .................................... 20096044

(51) Int. Cl.
*G01R 31/00*    (2006.01)
*G06K 7/00*    (2006.01)
*G01R 31/302*    (2006.01)

(52) U.S. Cl.
CPC ............ *G06K 7/0008* (2013.01); *G01R 31/302* (2013.01)

(58) Field of Classification Search
CPC  G06K 7/0008; G06K 7/0095; G06K 7/10465
See application file for complete search history.

(56) References Cited

U.S. PATENT DOCUMENTS

| 2006/0202705 | A1 | 9/2006 | Forster |
| 2006/0226983 | A1 | 10/2006 | Forster et al. |
| 2009/0073070 | A1* | 3/2009 | Rofougaran ................. 343/793 |
| 2009/0167502 | A1 | 7/2009 | Erickson et al. |
| 2009/0189816 | A1* | 7/2009 | Nikitin et al. ................ 343/702 |

FOREIGN PATENT DOCUMENTS

| WO | WO 2006/069243 A1 | 6/2006 |
| WO | WO 2006/121897 A1 | 11/2006 |
| WO | WO 2007/131879 A1 | 11/2007 |

OTHER PUBLICATIONS

Field Regions, available at http://www.antenna-theory.com/basics/fieldRegions.php as of Dec. 2, 2008.*

* cited by examiner

*Primary Examiner* — Melissa Koval
*Assistant Examiner* — Daniel Miller
(74) *Attorney, Agent, or Firm* — Birch, Stewart, Kolasch & Birch, LLP

(57) ABSTRACT

A method for testing remote transponders. In the method, a radio-frequency transponder is excited by sending an excitation command having a minimum threshold transmission power with the aid of a first electromagnetic field and the response of the radio-frequency transponder to the excitation command is measured with the aid of a second electromagnetic field in order to test if a corresponding received power threshold is exceeded. One of the fields is a radiating field and the other of the fields is a reactive field. The need to test transponders separately from other transponders and the need to inactivate or screen other transponders in the vicinity of the transponder being measured is eliminated.

11 Claims, 2 Drawing Sheets

METHOD FOR TESTING TRANSPONDERS

CROSS-REFERENCE TO RELATED APPLICATIONS

The present application claims priority under 35 USC 119(c) to Finish Patent Application No. 20096044 filed Oct. 9, 2009 and under 35 USC 365(c) to PCT/FI2010/050775 filed Oct. 6, 2010 the entire contents of which are hereby incorporated by reference.

BACKGROUND OF THE INVENTION

1. Field of the Invention

The present invention relates to a method and apparatus for testing individual remote transponders, particularly RFID transponders. The invention also relates to a corresponding testing system.

2. Description of Background Art

Manufacturers of RFID transponders typically test every transponder they make either on the manufacturing line, or in immediately subsequent process stages. If transponder manufacture is automated, the aim is to perform testing on the manufacturing line. The most common form of testing is to try to read the contents of the transponder in a reactive field, using an RFID reader and a near-field antenna. If reading fails, the transponder is flagged as faulty.

In the case of UHF transponders, a problem in this form of testing is that transponders with a performance significantly below the target level pass the test. This is because even faulty transponders can be successfully read a reactive field (near field), but in a radiating field (far field) their reading distance is so small that in practice they are useless. In addition, if it is wished to make performance measurements during testing, for example by measuring how much power is required to activate the transponder, or how strong a response is received from it, it is difficult or even impossible to apply measurement results obtained in a reactive field to real use taking place in a radiating field.

One solution to this is to test transponders directly in a radiating field. Such testing is indeed presently done and, on the market, it brings added value particularly to more expensive transponders with a higher processing value. However, there is a problem during testing that on the manufacturing line and often also in the various processing stages of the delivery chain the transponders are very close to each other and it is difficult to measure an individual transponder in a radiation field in the presence of other transponders. Various solutions for this have been presented, such as selecting the transponder to be measured on the basis of its memory content and screening the surrounding transponders or inactivating them for the duration of the detection. However these solutions have their own practical problems. A screening structure should be designed separately for each type of transponder, with the consequent additional engineering work. For their part, the memory contents of the transponders on the manufacturing line are often the same, so that sorting cannot be performed on their basis.

There are many publications relating to quality control of RIFD transponders, active players in the sector being at least Avery Dennison as a transponder manufacturer and Mühlbauer as a device manufacturer. Patent (application) publications dealing with the present subject in general as well as proposing specific testing solutions are at least EP 1990784, EP 1989559, and CN 10103361, US 2006/0012387, US 2006/271328, and US 2006/226983.

SUMMARY AND OBJECTS OF THE INVENTION

It is an object of the present invention to create a completely new type of testing method for remote transponders, with the aid of which it will be possible not only to measure individual transponders separately or in a group of several transponders close to each other, but also to obtain information on their operation in a radiating field.

The invention is based on the idea of testing the operation of a radio-frequency transponder by exciting the radio-frequency transponder with the aid of a first electromagnetic field and measuring its response with the aid of a second electromagnetic field, one of the said fields being a radiating field and the other of the said fields being a reactive field.

Advantages are achieved by the use of the invention, particularly in a situation, in which the radio-frequency transponder is one of a group of several radio-frequency transponders located near to each other, i.e. if there are several transponders in the area of influence of the radiating field. Thus, the response of the radio-frequency transponder in question can be measured selectively with the aid of said field arrangement.

In particular, the invention can be implemented using two antennae, in such a way that one of the antennae is arranged to operate in a radiating field, i.e. to produce a radiating field or to measure a signal in a radiating field, and the other of the antennae is arranged to operate in a reactive field, i.e. to produce a reactive field or to measure a signal in a reactive field. By using separate antennae of this kind for transmission and reception, the operation of transponders close to each other in a radiating field can be tested in a simple manner. However, it will be obvious to one skilled in the art that the antenna element of the reactive field and the antenna element of the radiating field can mechanically also be of the same mechanical antenna structure.

The invention also relates to a system for testing radio-frequency transponders. The system comprises
  a radio-frequency transmitter and an antenna connected to the radio-frequency transmitter,
  a radio-frequency receiver and an antenna connected to the radio-frequency receiver,
  a detection zone in the vicinity of one or the other of said antennae, into which detection zone a radio-frequency transponder can be brought in order to test its operation,
whereby one of the said antennae is a reactive field antenna, in the vicinity of which the said detection zone is situated and one of the said antennae is a radiating field antenna.

The system preferably comprises means for exciting the radio-frequency transponder with the aid of one of said fields and for receiving a signal from the excited radio-frequency transponder in question with the aid of the other of said fields.

The detection zone can be, for example, a determined zone on a conveyor belt, which is arranged to transport radio-frequency transponders.

The transponder to be tested is preferably an RFID transponder, i.e. a tag. The transponder is preferably a transponder operating in the UHF range. The invention is particularly suitable for testing UHF transponders, which are equipped not only with a radiating-field antenna, but also means, such as an inductive loop, for absorbing/producing a reactive field.

Considerable advantages are gained with the aid of the invention. First, the invention eliminates the need to measure transponders separately from other transponders. In addition, the invention eliminates the need to screen the transponders during testing using special arrangements. Further, the invention eliminates the need to inactivate other transponders than that being tested, during testing. The invention can be therefore applied, for example, to existing types of transponder in RFID-transponder production facilities and without significant alterations to production lines.

With the aid of the invention, a simpler and more versatile testing configuration than when using the screening method, as screening structures must be designed separately for each type of transponder and roll.

In the present context, a reactive field refers to an electromagnetic field component which is in the vicinity of the antenna is non-propagating, and which attenuates rapidly as a function of distance, typically a magnetic field (inductive measurement) or an electric field (capacitive measurement), which connects to the transponder being measured (reactive field as the transmission field), or from the transponder being measured (reactive field as the reception field).

In the present context, a radiating field refers to an electromagnetic fieldcomponent which connects to the transponder being measured (the radiating field as the transmission field) or from the transponder being measured (the radiating field as the reception field).

The boundary between a reactive and a radiating field can be regarded as being the distance at which the reactive and radiating field components of an antenna are equal in magnitude. The distance varies according to both the type and the shape of the antenna and to its orientation.

Roughly, it can be stated that in reactive-field measurement the distance of the transmitting antenna (external antenna or transponder being measured) from the receiving antenna (transponder being measured or external antenna, respectively) is typically at most $0.62*SQRT(D_1^3/\lambda)$, in which $D_1$ is the largest dimension of the transmitting antenna and $\lambda$ is the wavelength used. On the other hand, in radiating-field measurement, the transmitting antenna (external antenna or transponder being measured) is typically greater than $0.62*SQRT(D_2^3/\lambda)$, in which $D_2$ is the largest dimension of the transmitting antenna and $\lambda$ is the wavelength used.

According to one embodiment, the antenna operating in the reactive field is also located at a distance from the transponder being measured that is less that the distance of the transponder in question from the other transponders, thus ensuring that the antenna excites precisely the correct transponder, or that it is sensitive to the signal of precisely the correct transponder. The distance of a near-field antenna from the transponder being measured can be, for example, less than or equal to half of its distance from the next nearest transponder. An antenna operating in the UHF range is typically located at a distance of at least 10 cm from the transponder being measured and an antenna operating in a reactive field is closer than this to the transponder being measured, at a distance of, for example, 0.1-5 cm.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
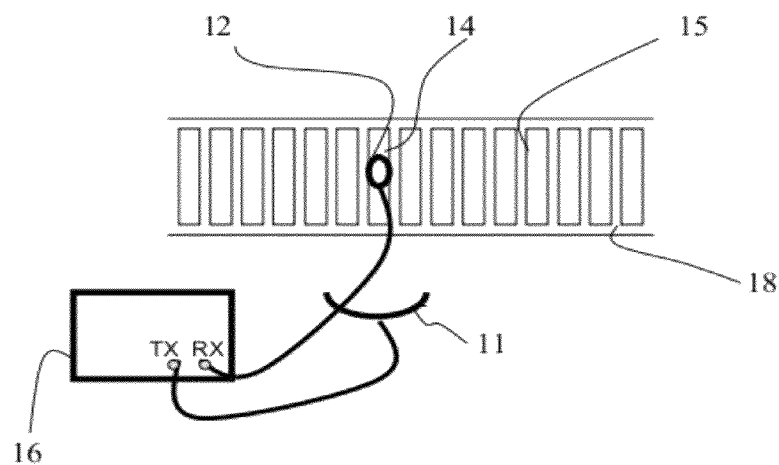
FIG. 1 presents schematically a measuring arrangement according to one embodiment of the invention.
Figure 2:
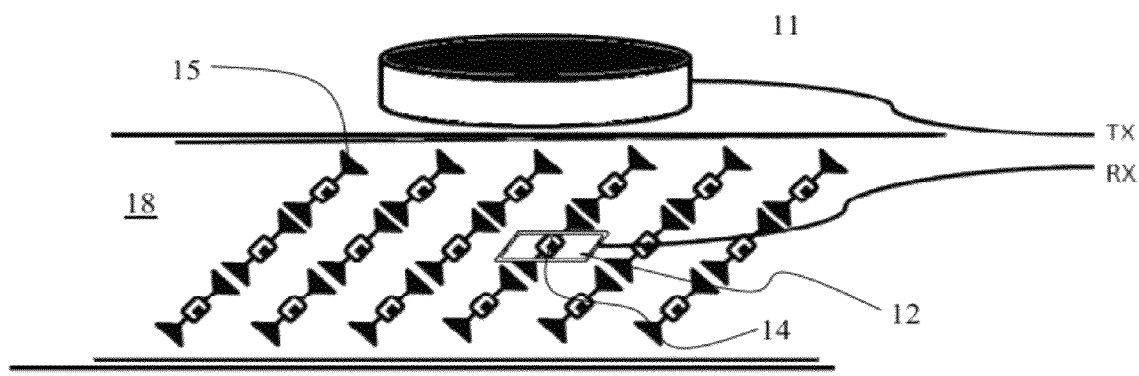
FIG. 2 presents schematically a measuring arrangement according to a second embodiment of the invention.

FIGS. 1 and 2 present examples of measurement arrangements, in which a radiating field is used as the transmission filed, which is created by using an antenna 11 suitable for producing a radiating field. Reception takes place in a reactive field with the aid of a reactive-field antenna 12. In the example of FIG. 1, the transponder 14 being measured and the other transponders 15 are situated essentially in a row, whereas, in the example of FIG. 2, the transponder 14 being measured and the other transponders 15 form a two-dimensional matrix. The transponders are placed on a suitable base 18, which on an RFID-transponder production line can be a track, for example a conveyor belt. The transmission and reception antennae 11, 12 are connected to a reader unit 16, which contains the necessary means for sending transmission power to the transmission antenna 11 and for measuring the power received from reception antenna 12. The reader unit 16 can be, for example, a conventional commercially available RFID reader device, or a measuring device specifically designed for that purpose.

The test arrangement described above is advantageous in case the sensitivity of an transponder is to be tested. Because there are several transponders in the range of influence of the radiating field, more than one transponder may also respond to a transmitted command. By using a reactive-field antenna, which is located close to the transponder being tested, to detect the response, a signal connected from the transponder being tested to the antenna will be considerably stronger than that from the other transponders and it will be possible to ensure that the transponder being tested responds to the excitation command.

With the aid of the measurement described above, it can be ensured that there is a good connection between the internal antenna and chip of the transponder. A poor connection will typically cause circuit losses, in which case more power will be required to activate the transponder. At the same time, the antenna's radiation properties are being tested, as the transponder is excited using a relatively low radiating power. In addition, the operation of the transponder in a reactive field will be tested. This is possible, because most of particularly present inlay transponders are equipped with an inductive loop or similar, so that they can also be read through a magnetic field.

In practice, the invention can also be implemented by exchanging the tasks of the radiating field and the reactive field, i.e. by using a reactive-field antenna to create the excitation and measuring the response in a radiating field. In this case, only a single transponder will response to the command, as the power received by the surrounding transponders will be less than the power required to activate them.

This measurement method has in practice the same advantages as when measuring the other way round. Now, by adjusting the transmission power to be close to the threshold power of the operating transponder, the operation of the transponder in a reactive field and the quality of the chip connection of the transponder can be ensured. The operation of the antenna can be ensured by the fact that the receiving antenna receives sufficiently high power. An additional advantage of this arrangement is that not only the far-field sensitivity of the transponder being tested can be measured, but also the strength of the 'backscatter' signal of the transponder's response in far field.

According to one embodiment, both of the aforementioned measurements are performed on each transponder, so that more information is obtained on the operation in a radiating field of an individual transponder, thus, in the real operating situation of the transponder.

It should be noted that the present method also includes several variations, which are not described here in greater detail. For example, it is possible to use two or more reactive antennae, which are located correspondingly in the vicinity of different transponders, and thus to detect the responses of several transponders simultaneously.

According to one embodiment, the invention is utilized in transponder quality control, i.e. to remove faulty units that have occurred in production, before the transponders reach the market. Such a GO/NO-GO test can be designed simply, in such a way that
- determining, using the arrangement according to the invention in a specific measurement geometry the threshold transmission power needed to excite a transponder operating properly, i.e. the power at which a jump increase of power is detected in the receiver, as well as the power received with this threshold transmission power,
- selecting a value, which is greater than the threshold transmission power, for use as the threshold power,
- selecting a threshold reception power, which is less than the received power at the threshold transmission power,
- using the selected transmission power to measure power levels received from several transponders and, if the received power is less that the selected threshold reception power, flagging the transponder as faulty (NO-GO).

A value, which is only slightly greater, for example 0.5-5 dB greater than the threshold transmission power measured with an operating transponder, is typically used as the transmission power. This ensures that the ability of the transponder to absorb the excitation field energy will be detected. Further, a value, which is only slightly less, for example 1-10 dB less that the measured received power at the threshold transmission power, is selected as the threshold reception power. This ensures detection of the ability of the transponder to produce a response signal.

Radio-frequency transponders can be finished unit transponders in an inlay or other form, or they can be still not separated from each other in a matrix form on a roll or other base.

Typically, the present system is added as part of a radio-frequency-transponder production line. The system comprises
- a radio-frequency transmitter and an antenna connected to the radio-frequency transmitter,
- a radio-frequency receiver and an antenna connected to the radio-frequency receiver,
- a detection zone in the vicinity of one or other of the said antennae, into which detection zone a radio-frequency transponder can be brought in order to test its operation, whereby one of the said antennae is a reactive-field antenna, in the vicinity of which the said detection zone is located, and the other of the said antennae is a radiating-field antenna.

The detection zone can be, for example, a predefined zone on a conveyor belt, which is arranged to transport radio-frequency transponders.

According to one embodiment, the present system comprises means for writing to a radio-frequency transponder, for checking the memory content of a radio-frequency transponder, or for transmitting other commands to a radio-frequency transponder, in connection with testing. Thus, several operations, or essentially all the operations for ensuring the quality of radio-frequency transponders can be performed in the same stage and using the same equipment.

Example

In order to check the industrial applicability of the invention, a test series was performed, in which a radiating antenna was used to transmit an excitation field to an transponder matrix, in which the transponders were situated as a three-lane band at a distance of 10 cm, and a loop-type reactive antenna for detecting and interpreting the response. The principle of the measuring system corresponds to the arrangement shown in FIG. 2.

In the measurement, the transmitted power was swept and a measurement was made as to how powerful a response was received from the transponders a) to the reactive antenna, b) to the radiating antenna (the same as the transmission antenna) at each power. In this form of measurement, when using higher levels of power more transponders respond to a command and it is wished to detect whether the transponder being tested responds and, if it responds, how strongly.

Figure 3:
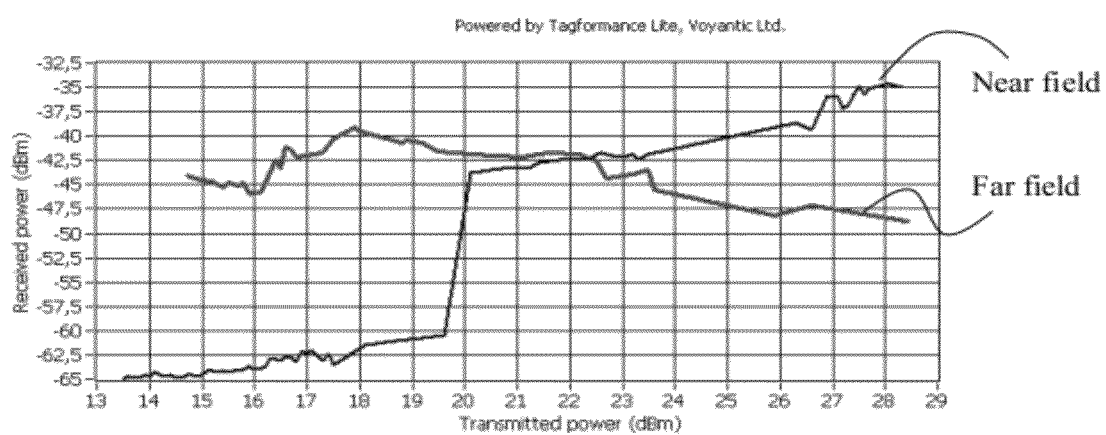
FIG. 3 presents the transmission power and received power in a measurement, in which a test arrangement according to FIG. 2 was used.

The measurement results are shown in FIG. 3. With the radiating antenna, the transponders respond on top of each other, and there is no great difference in the transponder's response returning to the antenna. In the case of the reactive antenna, it is seen that at a low transmission power the first transponders begin to excite, but the transponder being tested excites only at about +20 dBm, at which a significant jump in the return signal is visible.

In the measuring system in question, it is possible to design the transponder's GO/NO-GO test in such a way that the transmission power is adjusted to, for example, +21 dBm, and a test is made as to whether a response of more than −50 dBm is received from each transponder, using a near-field antenna. This will test the transponders very comprehensively.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. Method for testing operation of a radio-frequency transponder, the method comprising the following steps:
   exciting the radio-frequency transponder by sending an excitation command having a minimum threshold transmission power with the aid of a first electromagnetic field, and
   measuring a response of the radio-frequency transponder to said excitation command with the aid of a second electromagnetic field in order to test if a corresponding received power threshold is exceeded,
   wherein one of said fields is a propagating radio-frequency field and the other of the said fields is an electromagnetic near field providing an inductive or capacitive connection.

2. Method according to claim 1, wherein the radio-frequency transponder is one of a group of several radio-frequency transponders positioned adjacent to each other.

3. Method according to claim 1, wherein the first field is a radiating field and the second field is a reactive field.

4. Method according to claim 1, wherein the first field is a reactive field and the second field is a radiating field.

5. Method according to claim 1, comprising using a first and a second antenna, one of which being arranged to produce said radiating field or to measure a signal in said radiating field and the other being arranged to produce said reactive field or to measure a signal in said reactive field.

6. Method according to claim 5, wherein the antenna operating in the radiating field is located at a distance of at least $0.62*SQRT(D_2^3/\lambda)$ from the transponder, where $D_2$ is the greatest dimension of the antenna and $\lambda$ is the wavelength used, and the antenna operating in the reactive field is closer to the transponder, at a distance of at most $0.62*SQRT(D_1^3/\lambda)$ from the transponder, when $D_1$ is the greatest dimension of the antenna and $\lambda$ is the wavelength used.

7. Method according to claim 5, wherein the antenna operating in the reactive field is located at a distance from the transponder being tested that is less than the distance of the transponder in question from the other transponders.

8. Method according to claim 1, comprising measuring the strength of the signal received from the transponder and classifying the transponder according to the received power.

9. Method according to claim 1, comprising
determining a threshold transmission power of the first field required to excite a reference transponder, and the received power of the second field at the threshold transmission power,
selecting a value, which is greater than the threshold transmission power, for use as a transmission power,
selecting a value, which is less than the power received at the threshold transmission power, as a threshold reception power,
measuring the power received from the transponder being tested using the selected transmission power,
when the power from the transponder is less than the selected threshold reception power, flagging the transponder as being faulty.

10. Method according to claim 1, wherein the radio frequency transponders are RFID transponders.

11. Method according to claim 1, wherein the radio frequency transponders are UHF-range RFID transponders.

* * * * *